(12) United States Patent
Oden

(10) Patent No.: US 11,609,419 B2
(45) Date of Patent: Mar. 21, 2023

(54) MICROELECTROMECHANICAL SYSTEM CONTACTOR SPRING

(71) Applicant: Texas Instruments Incorporated, Dallas, TX (US)

(72) Inventor: Patrick Ian Oden, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 607 days.

(21) Appl. No.: 16/425,884

(22) Filed: May 29, 2019

(65) Prior Publication Data

US 2020/0379249 A1 Dec. 3, 2020

(51) Int. Cl.
*G02B 26/00* (2006.01)
*B81B 7/02* (2006.01)
*G02B 26/08* (2006.01)

(52) U.S. Cl.
CPC .............. *G02B 26/00* (2013.01); *B81B 7/02* (2013.01); *G02B 26/001* (2013.01); *B81B 2201/042* (2013.01); *B81B 2203/0315* (2013.01); *G02B 26/0841* (2013.01)

(58) Field of Classification Search
CPC ...... G02B 6/35; G02B 26/08; G02B 26/0816; G02B 26/01; G02B 26/101; G02B 26/0866; G02B 26/85; G02B 26/0841; G02B 26/105; G02B 26/0858; G02B 27/0172; B81B 2201/042; B81B 7/02; B81B 2203/0315; B81B 2203/0154; B81B 2203/0163; B81B 2203/04; B81B 3/0043; B81B 3/0083; B81B 3/0086; B81B 3/001; B81B 3/0051; B81B 2201/04; B81C 1/00436; B81C 1/00246; B81C 1/0023; B81C 1/00198; B81C 1/0096; B81C 2201/11; B81C 2201/0157
See application file for complete search history.

(56) References Cited

U.S. PATENT DOCUMENTS

| | | | |
|---|---|---|---|
| 8,610,997 B2 * | 12/2013 | Kaeriyama | G02B 26/06 359/291 |
| 10,589,980 B2 | 3/2020 | Oden et al. | |
| 11,085,995 B2 * | 8/2021 | Zhou | G08G 1/166 |
| 2016/0291320 A1 * | 10/2016 | Momose | G02B 26/0841 |
| 2021/0387851 A1 * | 12/2021 | Drabe | G02B 26/0808 |

* cited by examiner

*Primary Examiner* — Darryl J Collins
*Assistant Examiner* — Tamara Y. Washington
(74) *Attorney, Agent, or Firm* — Michelle F. Murray; Frank D. Cimino

(57) ABSTRACT

In described examples, a system (e.g., a microelectromechanical system) includes a substrate, a support coupled to the substrate and a first and second element. The first element includes a contactor spring having a first portion coupled to the support and having a second portion including a cavity having a sloped surface. A clearance from the sloped surface to the substrate is widened as the sloped surface extends away from the first portion. The second portion includes a first contact surface adjacent to the sloped surface. The second element is coupled to the substrate and has a second contact surface adjacent to the first contact surface. One of the first element and the second element is adapted: in a first direction to urge the first contact surface and the second contact surface together; and in a second direction to urge the first contact surface and the second contact surface apart.

19 Claims, 8 Drawing Sheets

MICROELECTROMECHANICAL SYSTEM CONTACTOR SPRING

BACKGROUND

Microelectromechanical systems (MEMS) can include devices such as actuators, switches, motors, sensors, variable capacitors and spatial light modulators (SLMs). The MEMS devices can be manufactured on a substrate. To protect such devices, sidewalls are formed on the substrate during manufacturing to form a sealable cavity, so that structures and devices within the cavity can be relatively isolated from an outside environment. However, contaminants can gradually migrate into the cavity and can react with or otherwise interfere with proper operation of devices included within the cavity.

SUMMARY

In described examples, a system (e.g., a microelectromechanical system) includes a substrate, a support coupled to the substrate and a first and second element. The first element includes a contactor spring having a first portion coupled to the support and having a second portion including a cavity having a sloped surface. A clearance from the sloped surface to the substrate is widened as the sloped surface extends away from the first portion. The second portion includes a first contact surface adjacent to the sloped surface. The second element is coupled to the substrate and has a second contact surface adjacent to the first contact surface. One of the first element and the second element is adapted: in a first direction to urge the first contact surface and the second contact surface together; and in a second direction to urge the first contact surface and the second contact surface apart.

DETAILED DESCRIPTION

Figure 1:
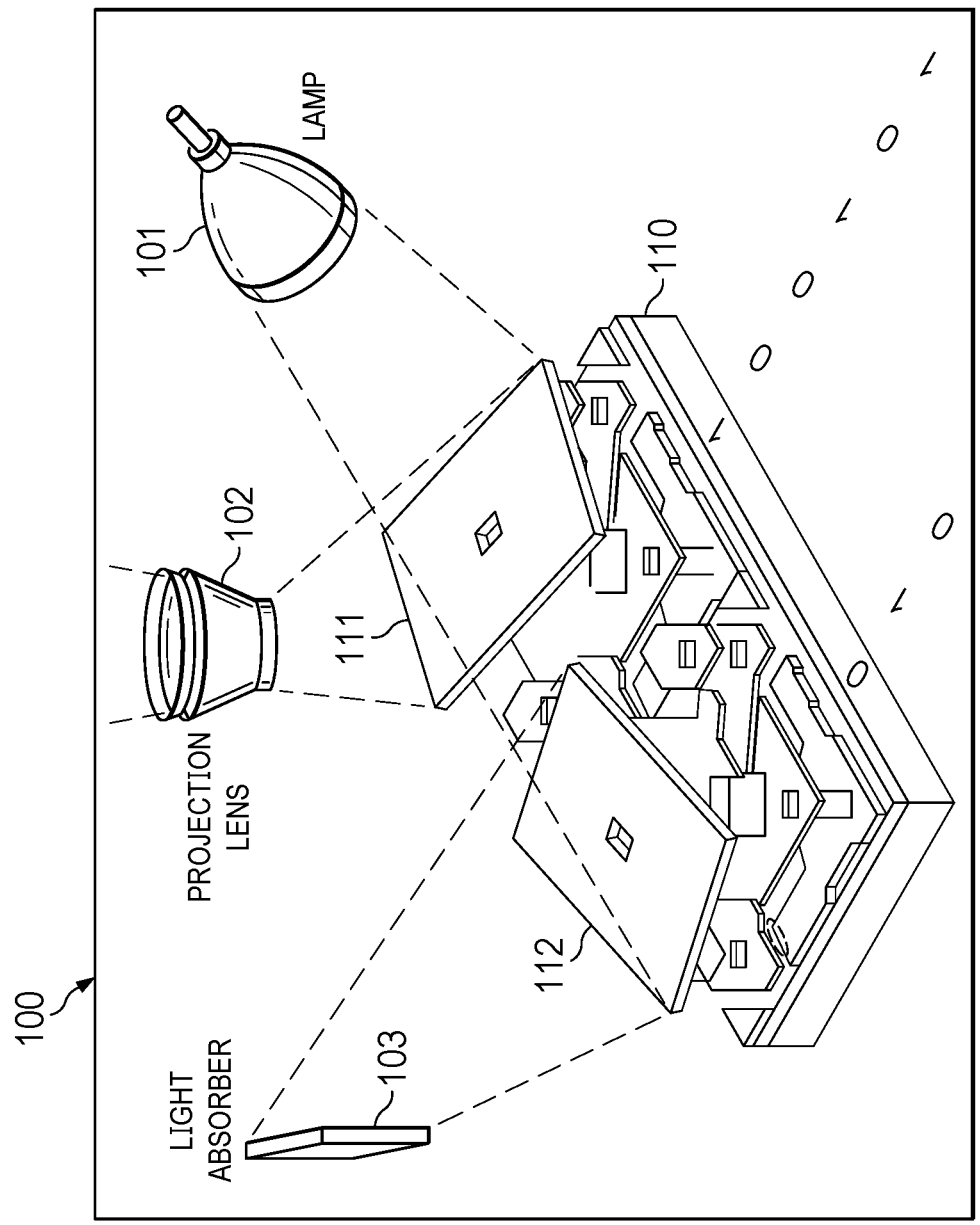
FIG. 1 shows representative components of an example image display system.

In the drawings, like reference numerals refer to like elements, and the various features are not necessarily drawn to scale.

Microelectromechanical system (MEMS) devices (such as actuators, switches, motors, sensors, variable capacitors and spatial light modulators) can have movable elements. For example, a spatial light modulator (SLM) device can include an array of movable elements (e.g., pixel modulator elements). Each such element can be an individually addressable light modulator element in which an "ON" or "OFF" position is set in response to input data. The input data can be image information for programming individual light modulator elements of the array to project or divert light directed at the array from an illumination source.

In an example SLM device of an image projection system, the input data can include bit frames generated in response to pixel hue and intensity information data of an image frame of an image input signal. The bit frames can be projected using a pulse-width modulation scheme. Pulse-width modulation schemes include weighted time intervals for projection of pixels of pixel hue and intensity corresponding to respective pixels in the input data. The weighted time intervals are sufficiently long to permit human eye integration over a given image frame display period. An example of an SLM device is a digital micromirror device (DMD), such as a Texas Instruments DLP® micromirror two-dimensional array device. Such DMD devices have been commercially employed in a wide variety of devices, such as televisions, cinemagraphic projection systems, business-related video projectors and picoprojectors.

DMD devices can be manufactured to include micromirrors to digitally image and project a digital image onto a display surface (such as a projection screen). For example, a projector system can include a DMD device arranged to modulate an incident beam of light received through a window glass of the DMD device and focused on micromirrors therein. Selected micromirrors can be individually and dynamically adjusted in response to input data to project a selected visual image onto a projection screen.

An individual micromirror can be coupled to (e.g., mounted on and/or supported by) a torsion spring. The torsion spring can be arranged as a hinge, which includes an axis (e.g., longitudinal axis), about which the micromirror can be rotated. In a configuration where the micromirror goes "hard over," the micromirror contacts (e.g., hits) a landing surface. The contacting micromirror can encounter environmentally induced adhesion (e.g., stiction) forces, which can prevent the micromirror from rebounding from the landing surface. Such stiction can result from environmental contamination (e.g., moisture), and the stiction can create improper operation and other reliability problems.

FIG. 1 shows representative components of an example image display system. The display system 100 includes a MEMS device spatial light modulator (SLM) integrated circuit (IC) that is arranged to project images as a spatially modulated projection beam. Light from a light source 101 can be directed onto an array of pixel modulator elements 111 and 112, where the modulation of the positions of the micromirrors of the pixel modulator elements 111 and 112 are individually controlled in synchronization with input image data. The light from the light source 101 is directed onto a display surface through a projection lens 102 (in a configuration where an element is in the "ON" position) or directed away from the display surface (e.g., and into a light absorber 103 in a configuration where the element is in the "OFF" position). FIG. 1 shows an array with two modulator elements, for example, for simplicity. A high-resolution array of an IC can include thousands (or more) of such elements arranged in rows and columns, with individual elements having a correspondence with pixel positions of a projected image.

In one example, each pixel modulator element includes a positionable (e.g., rotationally orientable and/or moveable)

element, such as a micromirror (e.g., 111 or 112), which is adapted to be tilted (e.g., rotated) between two positions (e.g., where the two positions can define opposing directions). The micromirror can be coupled to the substrate 110 through a torsion spring (e.g., 203 of FIG. 2, described hereinbelow) and a support (e.g., support 210 of FIG. 2). A micromirror includes a micromirror contact surface that is a surface of a micromirror (e.g., micromirror surface) adjacent to a spring tip (e.g., 204 of FIG. 2). The micromirror can come to rest against a landing element (e.g., a contact surface 501 of spring tip 204, described hereinbelow with respect to FIG. 5). In a first direction, an electrostatic force can be selectively applied to urge (e.g., force, pull, position, orient, move and/or apply force in an attempt to move) the first contact surface and the second contact surface together. In a second direction, an electrostatic force can be selectively applied in a second direction to urge the first contact surface and the second contact surface apart.

As described hereinbelow, the micromirror can "stick" to the fixed landing element in response to stiction forces. For example, stiction forces can be caused by Van der Waals force interactions operating in conjunction with meniscus/capillary formation. Van der Waals forces are effected by electrical interactions between two or more adjacent atoms or molecules. Capillaries (e.g., surface-tension induced aggregation of water molecules) can form in non-ultra-high vacuum non-UHV) and non-encompassed systems. Such capillaries can be dominated by water and other condensable/mobile species in the headspace and surrounding surfaces of a cavity for protecting an SLM device.

The amount of adhesion or stiction between a movable element and a fixed element is (for example) a factor in how much applied force is sufficient to cause the movable element to move (e.g., from a neutral position) or release (e.g., release from a landing surface). Example structures involving stiction can include contact surfaces (e.g., of the movable micromirrors in an SLM) that can be formed as protrusions to reduce the contact surface area, which can reduce the amount of stiction between a micromirror element and a landing element. Example SLM devices are described herein, and the accompanying description and methods described herein can be applied to a wide variety of MEMS components and configurations (e.g., so that the force applied to overcome stiction can be reduced to help initiate movement of micromechanical structures).

Examples of reduced contact surfaces (e.g., for reducing stiction) are described in the commonly assigned U.S. Patent Application Publication US 2018/0290880, published Oct. 11, 2018, entitled Isolated Protrusion/Recession Features in a Micro Electro Mechanical System, the entirety of which is incorporated herein by reference.

Figure 2:
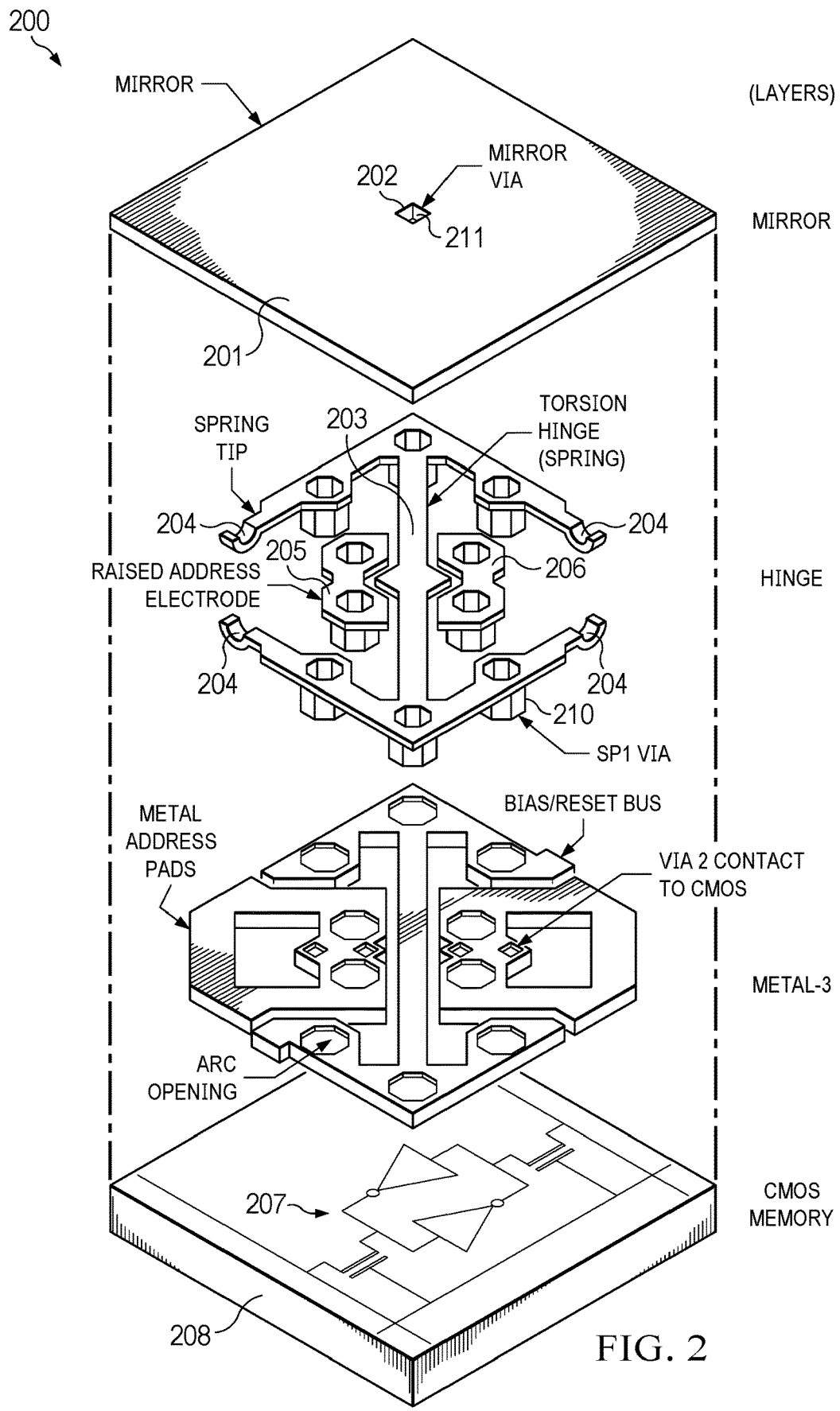
FIG. 2 is an exploded view of an example structure of a pixel modulator element of the image display system of FIG. 1.

FIG. 2 is an exploded view of an example structure of a pixel modulator element of the image display system of FIG. 1. Pixel modulator element 200 includes a micromirror 201. An array of micromirrors arranged on a single integrated circuit (IC) can form an optically active portion of an imaging element of the SLM of FIG. 1. An IC having an array of pixel modulator elements 200 can also be referred to as a digital micromirror device (DMD), which can also be referred to as a digitally controlled optical MEMS device.

In a configuration where the DMD is coupled to a source of illumination and aligned optical system components, the DMD can modulate the amplitude and/or direction of incoming light for creating two-dimensional optical images (images) or other light patterns. The DMD can be used to modulate light, so that video images can be projected on a display surface (e.g., screen). Other uses of a DMD include structured lighting, augmented reality, microscopy, medical instruments, spectroscopy, machine vision, industrial inspection, three-dimensional (3D) scanning, 3D optical metrology, automated fingerprint identification, facial recognition, interactive display, information overlay, chemical analyzers, photo-stimulation, virtual gauges and other optically related applications. The DMD can be used in systems providing image projection, in systems providing image capture, as well as in systems including both image projection and image capture. Light sources that can be modulated by a DMD include xenon lamps, laser light sources, LEDs and excited phosphors.

CMOS (complementary metal-oxide semiconductor) technologies are employed in processes to manufacture CMOS memory devices. A DMD chip can be fabricated using CMOS (or CMOS-like) processes to fabricate a substrate that includes CMOS memory. The DMD chip includes an array of individually addressable micromirror elements, where selected instances of the micromirrors are adapted (e.g., tilted) to reflect light in response to a memory state of a memory cell formed in the substrate (e.g., underlying substrate).

A memory cell can be formed in the substrate can be arranges as one memory cell that is included within an array of memory cells (e.g., so that the substrate includes an array of memory cells). The memory cell is coupled to electrostatic electrodes, each of which is adapted to selectively move a respective mirror, so that the respective mirror is adapted to reflect light in response to a memory state of the respective memory cell.

Selected instances of the micromirror are adapted to reflect light in one of at least two different directions in response to the memory state of a corresponding, underlying memory cell. (In some of the descriptions herein, terms such as "down" and "under" can be used to describe a relative direction extending generally away from the micromirror and towards the substrate, while such terms as "up" and "above" can be used to describe a relative direction away from the substrate and towards the micromirror.) By combining the DMD chip with aligned light source(s) and projection optics, the micromirror can be oriented (e.g., rotated) to reflect incident light into, or away from, the pupil of a projection lens of the projection optics.

In an example, a first state of the micromirror corresponds with a bright pixel dot, and the second state of the micromirror corresponds with a dark pixel dot. Gray scaling of the pixel dots can be achieved by pulse-width modulation (e.g., binary PWM) of the incident light (e.g., where the incident light is projected on a display screen). Coloring of the pixel dots can be achieved by selective activation of different colored light sources and/or filtering an illumination beam using one or more color filters (which can be stationary or rotating) to generate a selectively colored projection beam. The selectively colored projection beam can be imaged by coupling one, two, or three or more DMD chips in an optical path configured to generate the selectively colored projection beam.

Example DMD chips can have a variety of architectures, such as an example design including a structure having a micromirror 201 that is rigidly connected (e.g., by the connector support 211, where the rigid connection is illustrated in exploded view of the pixel modulator element 200) to an underlying yoke. The yoke is supported (e.g., connected) by two flexible (e.g., mechanically pliant) torsion spring 203 arms, where the arms are coupled to a respective support post, which in turn are coupled to (e.g., supported by) the underlying substrate. Electrostatic fields are controllably generated in opposing areas between an underlying memory cell and a respective micromirror, which can cause rotation of the supported micromirror in a selected one of a positive rotation direction and a negative rotation direction.

Examples of chip fabrication of the DMD superstructure as described herein include an underlying CMOS memory circuit, upon which the DMD superstructure is formed. The DMD superstructure can be formed by sequentially forming a series of patterned photoresist layers deposited over exposed surfaces of an integrated circuit (e.g., the underlying CMOS memory circuit). The various elements of the example DMD superstructure can be formed in response to a sequence of processes for progressively forming layers of metal. For example, aluminum layers (e.g., for forming the address electrode, hinge, yoke and micromirror) can be deposited over the surfaces of hardened photoresist (e.g., photoresist layers of photoresist) and selectively etched to form spatial openings (e.g., voids and/or air gaps) between various superstructure elements in response to chemical processes during which the photoresist layers are removed.

The general operation and construction of a DMD chip is described in U.S. Pat. No. 9,348,136, issued May 24, 2016, entitled Micromirror Apparatus and Methods, the entirety of which is incorporated herein by reference. Other examples of MEMS devices employing micromirrors are described in U.S. Pat. Nos. 7,011,415 and 7,404,909, the entireties of both of which are incorporated herein by reference.

A DMD chip can include a micromirror array, a memory array, a data-controller receiver and a micromirror array reset control. An example micromirror array can include hundreds of thousands (or more than a million) of reflective, individually positionable (e.g., individually moveable and/or orientable), digitally switchable, micrometer-sized micromirrors. The micromirror array can be organized in a two-dimensional (e.g., "n" column by "m" row) array (or other systematically arranged array).

The micromirrors can be aluminum elements that are 1 through 20 microns in size (e.g., that are arrayed along a 7.6-micron pitch), where at least some of the micromirrors are switchable between discrete angular positions. For example, selected micromirrors can be switched (e.g., tilted) to an angle of +12 degrees for an "ON" state and can be switched to an angle of −12 degrees for an "OFF" state. The switching angle can be relative to a 0-degree flat reference state (e.g., a "parked" or neutral state). The micromirrors are parked in an inactive state, in which the parked micromirrors are parallel to the plane of the array substrate. The parked position in this example does not usually correspond to a latched position (e.g., a position controlled by the ON or OFF state of the underlying memory cell).

In an ideal example, the surface of the micromirror is flat while being rotated between the discrete angular positions. The rotation of the micromirrors through the angular positions can include a tilt angle (e.g., tilt position), where the tilt angle ideally lies within a notional plane orthogonal to the hinge-axis (e.g., the longitudinal axis of a torsion spring 203). The ON-state position can include a tilt angle of rotation toward one side of the encapsulating package (e.g., package that encapsulates the micromirror), while the OFF-state position can include a tilt angle of rotation toward an opposing side of the encapsulating package.

The memory array can be arranged as a two-dimensional array of 1-bit CMOS memory cells. The memory array can be addressed on a column-by-column basis, over a double data rate (DDR) bus. The DMD can be controlled in response to control signals asserted by a digital controller chip. The control signals can coordinate the storage and latching of information for indicating an angular position of a micromirror of a selected pixel modulator element of the array of pixel modulator elements. At least one of the selected pixel modulator elements of the array of pixel modulator elements includes a respective electrode for electrostatically positioning a respective micromirror in response to a respective memory cell. Each of the individual micromirrors can be arranged adjacent to (e.g., arranged over) a corresponding CMOS memory cell.

A particular micromirror is adapted to assume a selected angular position in response to a binary state (e.g., logic 0 or 1) of the corresponding CMOS memory cell (e.g., in synchronization with a micromirror clocking pulse). The changes of the angular position (e.g., +12 degrees or −12 degrees) of an individual micromirror can be synchronized with the micromirror clocking pulse, which is not necessarily coincident with a memory cell data update. In an example, writing a logic 1 state into a memory cell followed by a micromirror clocking pulse results in the corresponding micromirror switching to a +12 degree ON-state position, and writing a logic 0 state into a memory cell following by a micromirror clocking pulse results in the corresponding micromirror switching to a −12 degree OFF-state position.

Updating the angular position of the micromirror array can be performed by two operations. In a first operation, the contents of the memory are updated by addressing and latching a selected value in the addressed memory cells. In a second operation, a micromirror reset signal can be applied to the entire portion (or other portion) of the micromirror array (e.g., depending on an associated system architecture). Micromirror reset pulses can be generated internally by the DMD chip, where the application of the micromirror reset pulses is coordinated by a digital controller.

The pixel modulator element 200 includes a micromirror 201, which is coupled to (e.g., supported by) a via support column 202 to a torsion spring 203 (e.g., arranged as a torsional hinge). In response to a change of the angular position of a selected micromirror, a portion of the lower surface of the micromirror contacts a respective underlying landing element (e.g., a spring tip 204 described herein). The spring tip 204 can be elevated by a support (e.g., support 210) coupled to the substrate 208. A spring tip 204 can flex (e.g., by which energy can be absorbed and stored) in response to the micromirror landing on the spring tip 204.

Figure 9:
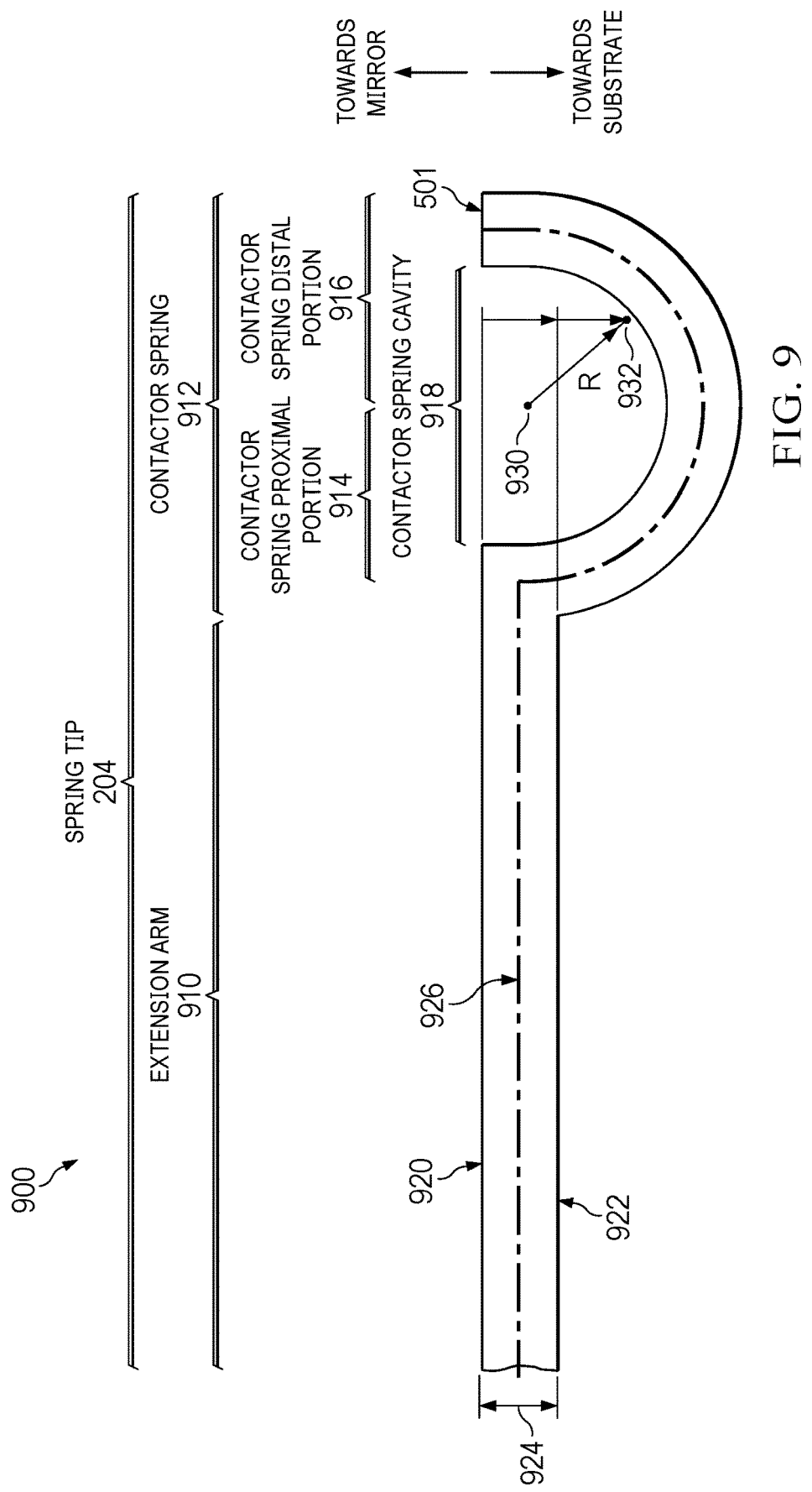
FIG. 9 shows an example reduced contact surface of an example spring tip.

The spring tip 204 can include a respective contactor spring (e.g., contactor spring 912, described herein with reference to FIG. 9). The contactor spring 912 distally extends from a support element (e.g., support 210). The contactor spring 912 includes a proximal portion 914 (e.g., first portion) and a distal portion 916 (e.g., second portion). The contactor spring 912 includes a cavity (e.g., formed using a curved surface), where the cavity includes a distal portion (e.g., second portion, which can be shaped like the end of a hook). The distal portion of the cavity includes a sloped surface that increasingly extends away from the substrate (e.g., so that a clearance from the spring tip 204 to a substrate 208 is widened as the sloped surface extends away from the proximal portion). The spring tip 204 includes a first contact surface adjacent to (e.g., adapted to contact) a vertical terminal surface of the distal portion.

As described hereinbelow, an example mechanical element such as the contactor spring can be formed using gray-scale photolithography. Examples of gray-scale photolithography are described in U.S. Pat. No. 9,864,188, issued Jan. 9, 2018, entitled Operation/Margin Enhancement Feature for Surface-MEMS Structure; Sculpting Raised Address Electrode, the entirety of which is incorporated herein by reference.

Each pixel modulator element of the array of pixel modulator elements can include two pairs of a spring tip 204 (e.g., where each spring tip 204 includes a contactor spring 912 of FIG. 9) and a micromirror 201. Micromirrors of the micromirror array respectively include a second contact surface (e.g., for contacting a first contact surface of a respective spring tip 204). A respective micromirror is adapted to move in a first direction to urge the first contact surface and the second contact surface together; and is adapted to move in a second direction to urge the first contact surface and the second contact surface apart.

In another example, the spring tip 204 is adapted to move in a first direction to urge the first contact surface and the second contact surface together, and the spring tip 204 is adapted to move in a second direction to urge the first contact surface and the second contact surface apart.

Electrodes 205 and 206 are electrically driven to electrostatically urge (e.g., to apply a force so as to move, attempt to move and/or hold) the micromirror 201 toward either of two operating positions. The electrodes 205 and 206 are formed over the substrate, so that a portion (e.g., a partial portion or an entire portion) of a respective micromirror is formed over one of the electrodes 205 and 206. The electrodes 205 and 206 are coupled to a respective memory cell to electrostatically position the respective micromirror in response to the logic state latched by the memory cell. Accordingly, a respective micromirror of a selected pixel modulator element of the array of pixel modulator elements can be electrostatically positioned by a respective electrode (e.g., 205 or 206) in response to the respective memory cell coupled to the electrodes 205 and 206. The respective micromirror is adapted to move in a first direction in response to an electrostatic field distributed by the first electrode, and the respective micromirror is adapted to move in a second direction in response to an electrostatic field distributed by the second electrode.

Adjacent to (e.g., below) a micromirror 201 is a memory cell 207 that includes circuitry such as CMOS memory elements. The memory cell 207 includes circuitry formed on the substrate 208, where the circuitry is arranged to electronically latch a logic state adapted to indicate a selected one of the first and second directions (e.g., where the circuitry is adapted to control a physical state of a micromirror 201 in response to the logical state of a respective memory cell 207). The electronic state of the pixel memory cell determines, at least in part, the mechanical position of the micromirror.

In an example, toggling the contents of a memory cell does not necessarily result in an immediate change in the mechanical state of the respective micromirror. In the example, a "Reset" signal is asserted, so that the instant (e.g., present) state of a CMOS memory cell is transferred to an electrode controller to mechanically position the micromirror to the state latched by the respective CMOS memory cell. The assertion of the Reset signal momentarily releases the micromirror to assume a neutral position, so that the micromirror can proceed from the neutral position to re-land in one of the two positions capable of being determined by the state of the coupled CMOS memory cell. A reset operation can assert the Reset signal, so that selected groups of pixels can be individually pre-loaded over a period of time and the selected groups of micromirrors can change their respective mechanical positions synchronously (e.g., in response to a commonly asserted command signal).

The example DMD can be fabricated as a MEMS component that contains an array of peripheral and non-peripheral aluminum micromirrors formed over a substrate 208. The non-peripherally located micromirrors of the example array can be controlled to selectively rotate in response to digital information electronically latched in the CMOS circuitry of the substrate 208, while peripherally located micromirrors can be arranged to rotate (e.g., not in response to a latched memory state) to a selected default position (e.g., to deflect light on the periphery of the MEMS component that can otherwise reduce a contrast ratio of a projected image).

Such peripherally located micromirrors (e.g., which can be referred to as border micromirrors or as a "pond") are formed around the perimeter of the central core of active micromirrors in the array. The border micromirrors are not necessarily user-addressable and can tilt automatically into the −12 degree OFF position in response to power being applied to the device. An example implementation has a border micromirror width of 10 border micromirrors on the outer perimeter (e.g., edges) of an active micromirror array arranged having 912 rows by 1140 columns. The border micromirrors can serve the purpose of directing stray incident light out of the field of view of the projected light path.

Figure 3:
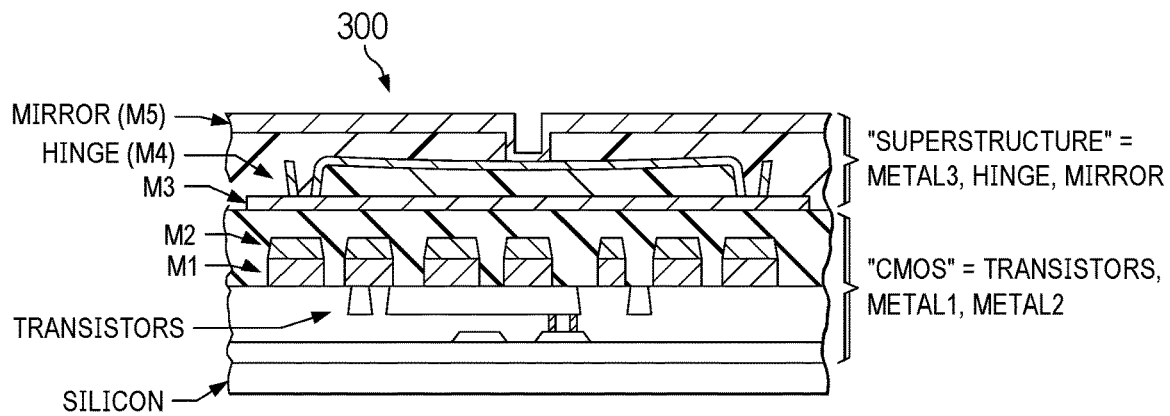
FIG. 3 shows a cross-section taken along a diagonal hinge axis of an example pixel element.

FIG. 3 shows a cross-section taken along the diagonal hinge axis of an example pixel element. In the example pixel element 300 cross-section, the MEMS micromirror of a pixel position is formed as a superstructure over a silicon substrate, which has been processed using CMOS manufacturing processes to form the memory array and other circuitry. The CMOS circuitry includes transistors (e.g., formed using doped silicon), electrical contacts and interconnects formed in two patterned layers of metal referred to as "Metal 1" (M1) and "Metal 2" (M2). Contacts to the underlying CMOS circuitry, such as "Via 2 Contact to CMOS" in FIG. 2, metal address pads and bias/reset bus elements can be formed through deposition and patterning of a third conductive layer, referred to as "Metal 3" (M3). A first photoresist layer (e.g., comprising a photoresist) can be formed and patterned over the patterned conductive layer M3. The patterned conductive layer M3 includes via openings (e.g., openings for vias).

A layer of hinge-forming material can include at least one layer of metal, referred to as "Metal 4" (M4), which is formed over the patterned first photoresist layer, and which is patterned to form a torsion spring 203 and various spring tips 204 and electrodes 205 (e.g., raised address electrodes) of FIG. 2. The hinge-forming material extends conformally into via openings to define supports 210 ("SPI Via" in FIG. 2) for the hinge and for the raised electrodes.

A layer of metal referred to as "Metal 5" (M5) can be formed by forming and patterning a second photoresist layer (e.g., comprising a photoresist) over the patterned hinge forming layer M4, which includes a central via opening. The metal layer M5 includes at least one layer of metal referred to as "Metal 5" (M5), which is formed over the patterned second photoresist layer, and which is patterned to form a reflective element (such as rectangular-shaped micromirror). The mirror-forming material extends into the via opening to define a connector support (e.g., mirror via 211) for the micromirror. To provide a flat surface for subsequent CMOS-related manufacturing processes, the second photoresist layer is planarized before deposition of the mirror-forming material. The first and second photoresist layers initially provide support to the hinge and mirror-forming layers during fabrication and are subsequently removed to release (e.g., by etching away temporary support structures that underlie) the hinge and micromirror following formation.

Figure 4:
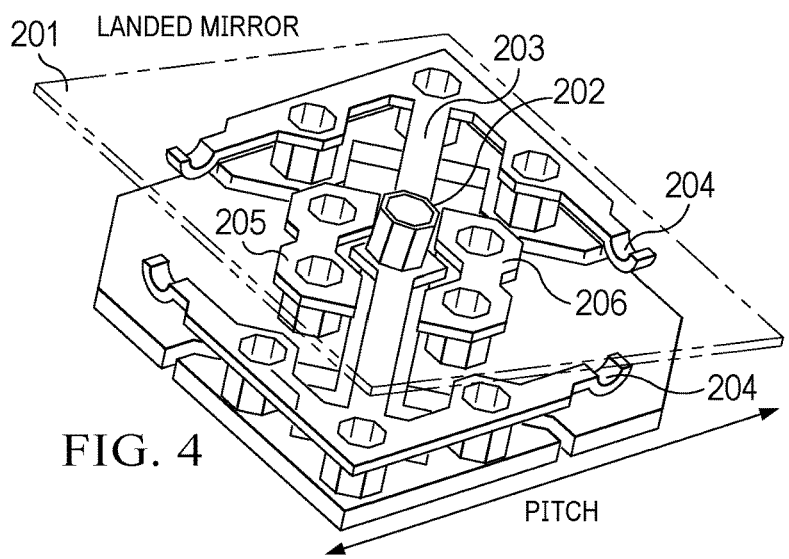
FIG. 4 and FIG. 5 are respectively orthographic and elevation views of the example pixel structure of FIG. 2, including an example micromirror being tilted to a 12-degree tilt angle.
Figure 5:
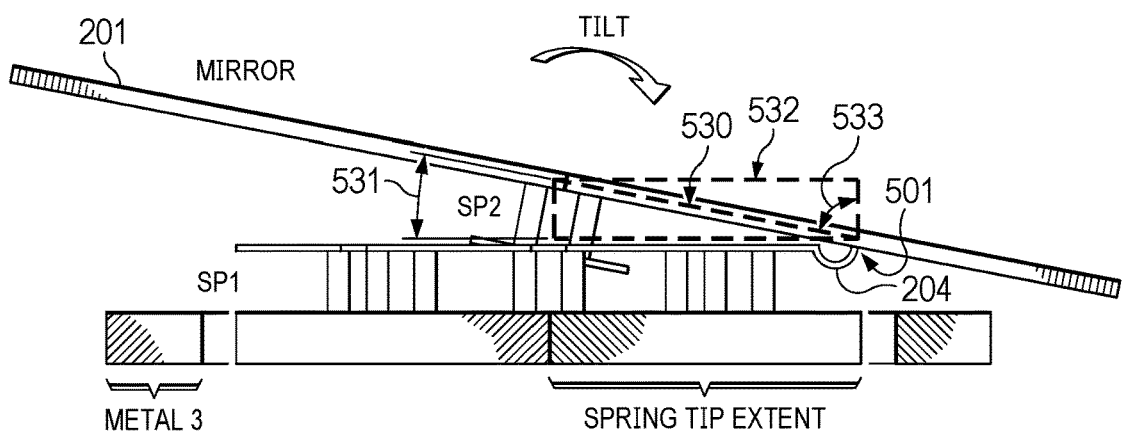

FIG. 4 and FIG. 5 are respectively orthographic and elevation views of the example pixel structure of FIG. 2, including an example micromirror being tilted to a 12-degree tilt angle. The micromirror 201 can be urged (e.g., by applying electrostatic forces) to tilt in response to the assertion of a Reset signal to the "ON" (+12 degree) or "OFF" (−12 degree) position. The Reset signal can be asserted in response to the logic state stored (e.g., as a logic 1 or logic 0 capacitively stored or electronically latched) in the underlying CMOS memory cell.

In one example, array micromirrors can be electrostatically and independently urged to a selected one of the ON or OFF positions. The output of each memory cell (e.g., a logic 1 or logic 0, which corresponds to a bit-plane bit for the corresponding pixel position) and its complement output are asserted to differentially energize (e.g., by coupling opposite potentials) a selected one of the respective electrodes 205 and 206. The electrodes 205 and 206 are arranged adjacent to (e.g., below) the micromirror on respective (e.g., opposing) sides of the hinge axis.

In response to a sufficient bias/reset potential being applied to the selected one of the electrodes 205 and 206, the micromirror 201 tilts about its hinge axis in response to an electrostatic attraction of the electrode having the greatest potential difference (e.g., voltage difference relative to the bias/reset potential). In response to the micromirror 201 being tilted (e.g., being rotated), the micromirror 201 contacts (e.g., lands) on the spring tips 204 adjacent (e.g., closest) to the energized electrode, which helps prevent contact of the micromirror 201 with the selected (e.g., energized) electrode, and which helps to pre-load mechanical forces for releasing the micromirror (e.g., under stored energy of spring action). In a configuration where the bias/reset potential is removed (e.g., by floating/tri-stating or setting the electrode pair differential to 0 volts), the micromirror 201 returns to a flat state (e.g., a neutral, intermediate position) in response to mechanical forces stored in the torsion spring 203 and the spring tips 204 that are flexed (e.g., pre-loaded).

Energy stored by spring tips 204 and torsion spring 203 are combined to help overcome stiction that can occur between contacting surfaces of a micromirror 201 and spring tips 204 at contact surface 501. As described hereinbelow with respect to FIG. 9, a spring tip 204 (such as the spring tip 900) can include a contactor spring 912 having a distal portion 916, which can increase the contact angle (e.g., for reducing the space within which condensation and capillary action can occur) between a contact surface 501 of the spring tip 204 and a contacting surface (e.g., of the substrate-side) of the micromirror 201. The contact surface 501 is a terminal portion of a distal surface of the spring tip 204 that contacts (e.g., physically contacts) a portion of surface of the micromirror 201. The contact surface 501 can be flat or radiused (e.g., so that a reduced contact point of a radiused curve is adapted to contact the micromirror 201).

In the example shown in FIG. 9, a spring tip 204 (such as the spring tip 900) can include an extension arm 910 that includes a first surface (e.g., 920 of FIG. 9) adjacent to the substrate (M3 of FIG. 5) and includes a second surface (e.g., 922 of FIG. 9) adjacent to the second element (e.g., micromirror 201). The contactor spring 912 includes a third surface (e.g., that includes surface points 932 of a radius R focused at surface point 932) adjacent to the second element (e.g., micromirror 201). A first distance from a first point of the second surface to the second element is less than a second distance from a second point (e.g., a surface point 932 shown in FIG. 9) of the third surface to the second element (e.g., micromirror 201). The first distance is less than the second distance in a configuration in which the first contact surface (e.g., 501) and the second contact surface are apart.

In a geometric example of an example pixel structure, a vertex (e.g., rightmost corner) of the right triangle 530 includes the angle 531, for example, that could otherwise result when the longitudinal axis of the upper surface 920 (e.g., micromirror-side) of the extension arm 910 is notionally extended to intersect a lower (e.g., substrate-side) surface of the tilted micromirror 201. In the example, the right triangle 532 is a similar triangle with respect to the right triangle 530 (e.g., so that the corresponding angles of the right triangles 530 and 532 have the same value). A vertex (e.g., rightmost) of the right triangle 532 includes the angle 533 that results between the contact surface 501 and the substrate-side (e.g., lower) surface of the tilted micromirror 201.

In accordance with geometric principles, the angle 533 is complementary to the angle 531, so that given a micromirror tilt of 12 degrees, the angle 531 is 12 degrees and the angle 533 is 72 degrees. The increase in the angle 533 of contact (e.g., from 12 to 72 degrees) decreases the proximity of surrounding adjacent surfaces of the spring tip 204 and micromirror 201. The decrease in the area of surrounding contact surfaces decreases the area in which meniscus/capillary formation can occur (e.g., so that stiction can be reduced) as described hereinbelow with respect to FIG. 6A through FIG. 6C.

Figure 6A:
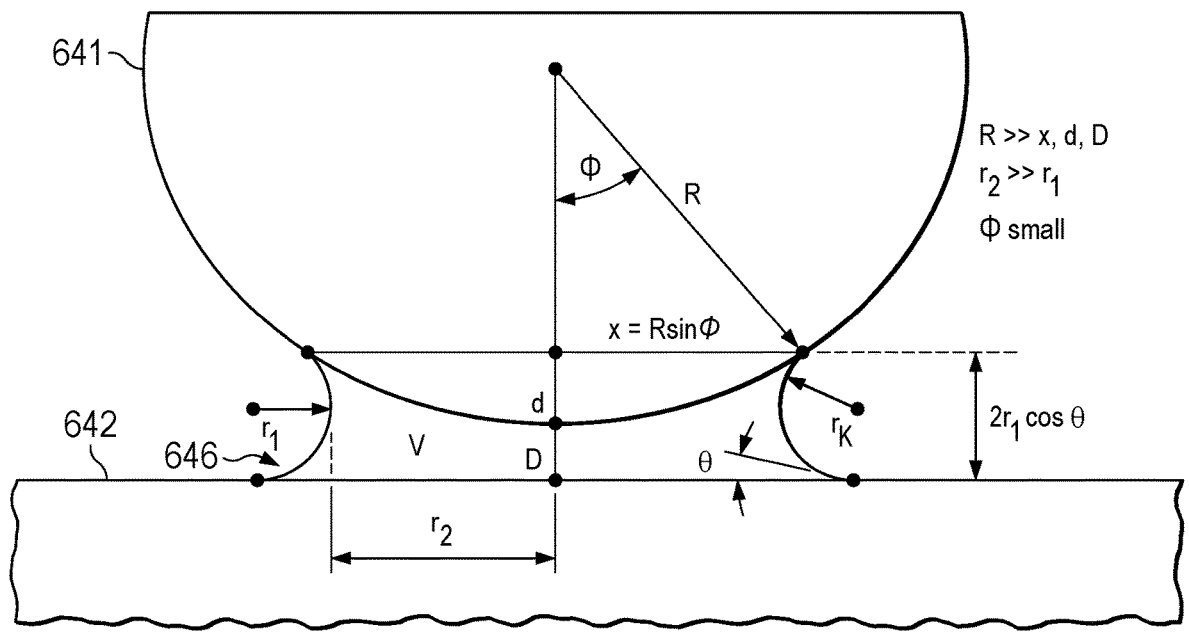
FIG. 6A, FIG. 6B and FIG. 6C show example capillary condensation on example pixel modulator elements.

FIG. 6A shows an example capillary condensation model that includes a flat surface (e.g., planar surface) adjacent to a curved surface. Capillaries can form in non-UHV spaces in the headspace of an MEMS package for encapsulating a MEMS device. The MEMS headspace can include water and other condensable/mobile species that can condense on (and around) surfaces in and surrounding the MEMS headspace. The spring tip 204 described herein can mechanically store energy (e.g., by deflecting as a curved leaf/plate spring in response to forces encountered in response to contacting a tilting micromirror), so that the stored energy can later be released to help counteract the adhesive energy associated with capillary condensation. Adhesive energy associated with capillary condensation can be described with reference to the Laplace Pressure expression, which is given herein as:

$$\Delta p = (-2\pi R)(d\gamma_L / r_1) \tag{1}$$

where R is the radius of a surface 641 (e.g., curved and/or spherical surface) that is adjacent to a flat (e.g., planar) surface 642. The term $d\gamma_L / r_1$ helps indicate the degree to which the meniscus forms (e.g., forms a meniscal shape) around the mechanical contact through the radius of the meniscus $r_1$ and the term helps indicate the correlated distance that the meniscus $r_1$ rises along the sphere (d) along with the interfacial energy of the capillary ($\gamma_L$). The term $-2\pi R$ is related to the geometry of the spherical surface and is negative, which indicates that meniscal forces are attractive forces.

A direct correlation exists between: (a) the interaction force of the meniscus/capillary; and (b) the radius (R) of the surface 641. A smaller radius yields a smaller capillary, which yields a concomitantly smaller interaction force. Similar forces can exist between two notional spheres, so that a smaller radius of curvature of the two spheres can result in a smaller meniscus/capillary and reduced attractive forces therebetween.

Figure 6B:
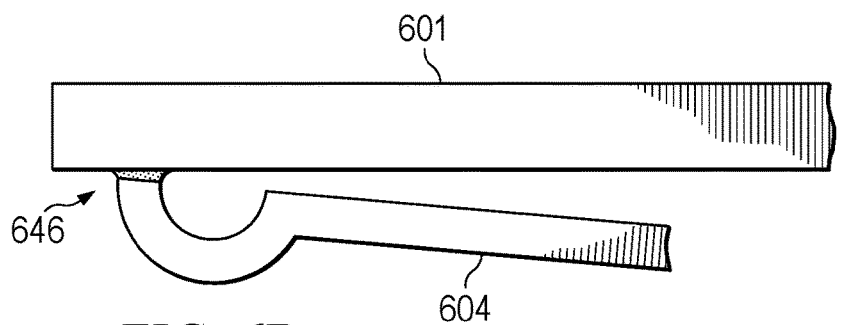

FIG. 6B shows capillary condensation that can occur between two example MEMS elements, such as a micromirror 601 resting against (e.g., on) a spring tip 604. A meniscus 646 (e.g., which can be a meniscus of a pendular ring of water or other condensable mobile species) can condense and progressively accumulate in adjacent interstitial spaces between the micromirror 601 and spring tip 204. The topology of the spring tip 604 limits (e.g., reduces) the stiction that accrues from the surface tension of the meniscus 646 that can otherwise occur between the micromirror 601 and spring tip 604. The stiction augmented by the meniscus 646 is less than, for example, the stiction augmented by a "wedge" of condensate that could otherwise form in response to the extension arm of the spring tip 604 being sufficiently close (e.g., such that capillary action occurs therebetween) to the micromirror 201.

Figure 6C:
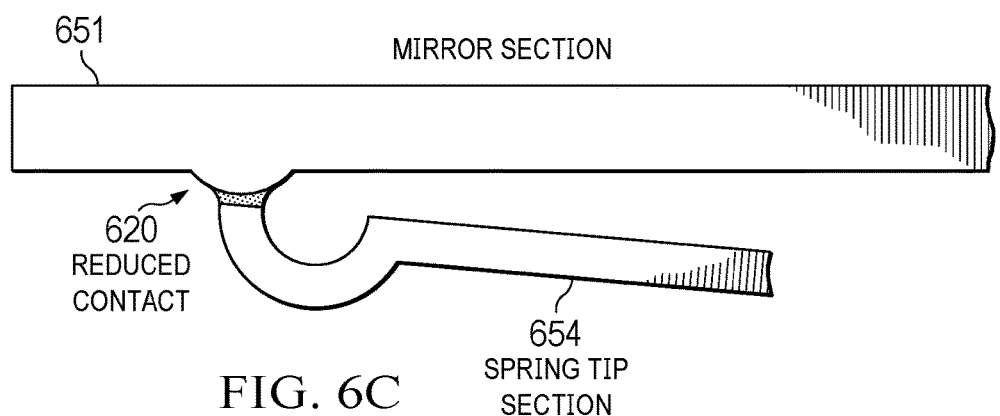

FIG. 6C shows capillary condensation that can occur between two example MEMS elements, such as a protrusion (e.g., reduced contact 620) of an element 651 (e.g., micromirror) resting against a spring tip 654. The example reduced contact is a protruding feature that is arranged to increase the clearance (e.g., height, or separation distance) between adjacent surface areas of elements 651 and 654. Increasing the clearance helps to reduce the surface tension of the meniscus because the radius of the meniscus decreases (e.g., decreases as a function of decreasing elevation) in response to the condensate being drawn in a direction (e.g., downwards) in response to forces for urging the spring tip 654 in the direction (e.g., downwards) and away from the element 651. Reducing the radius of the condensate can also reduce the amount of stiction between the two elements 651 and 654.

Figure 7:
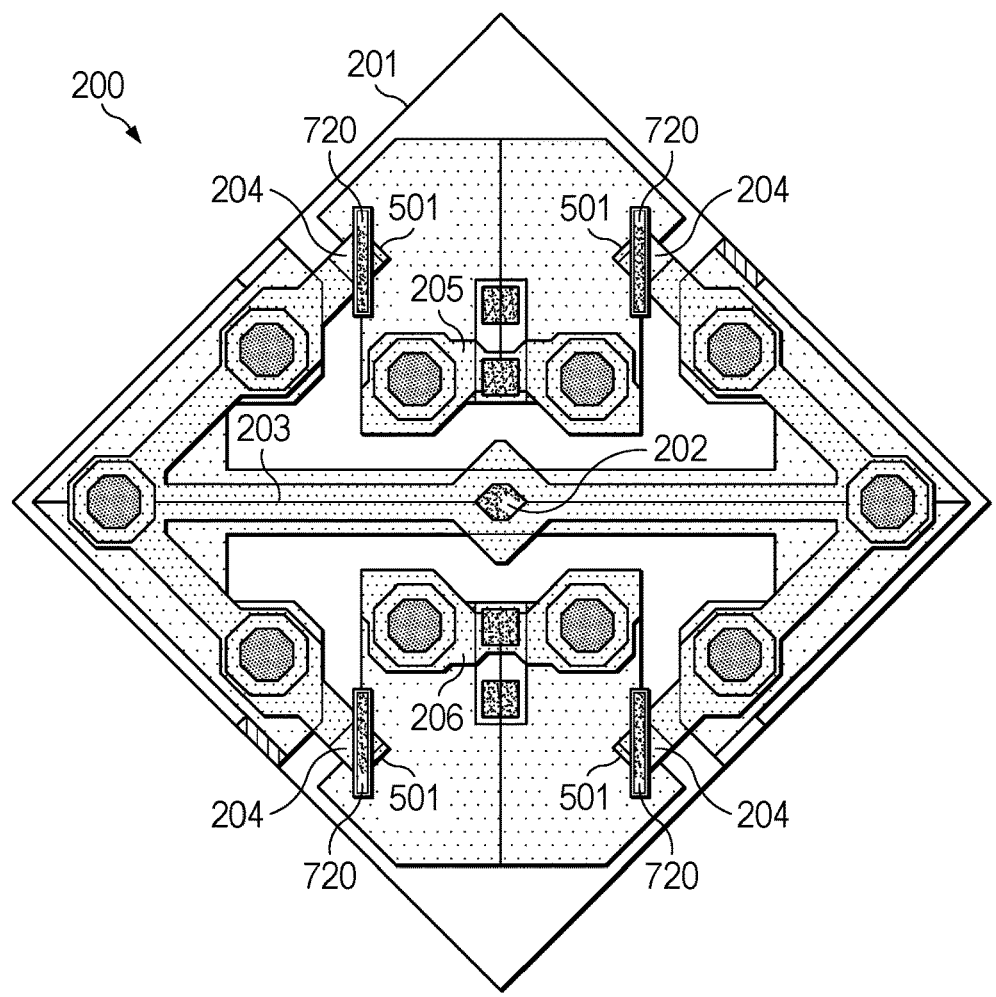
FIG. 7 is a phantom top view of an example pixel modulator element of FIG. 2.

FIG. 7 is a phantom top view of an example pixel modulator element of FIG. 2. The pixel modulator element 200 includes protrusions 720 (e.g., reduced contacts) that are formed on the substrate-side (e.g., bottom) side of micromirror 201. The protrusions 720 are adapted to reduce a contact area (e.g., contact surface 501) that could otherwise occur between the substrate-side of micromirror 201 and at least one of the protruding spring tips 204. Other examples of protrusions are described herein, such as the contact surfaces 846, 847 and 849 of FIG. 8.

The protrusions 720 can be formed as a suitable shape that has a curvature (e.g., pronounced curvature). In the phantom view, the protrusions 720 are shown as being linear wedges or "ribs," in which a rounded edge of a wedge forms a reduced contact surface due to a low radius of curvature (ROC). The protrusions 720 can each include a long axis that is diagonal (e.g., skewed) with respect to a long axis of a respective contact surface 501. In another example, the protrusions 720 can be an ellipsoidal cap, or an array of ellipsoidal caps. In yet another example, a protrusion on the substrate side (e.g., lower side) of micromirror 201 can contact a radiused surface extending from the terminal surface (e.g., the contacting surface) of spring tip 204. Other examples can include other shapes and configurations of protruding features having a small contact area between a movable element and another element in a MEMS device. The reduced contact surface can include sub-resolution features patterned using gray-scale photolithography.

In the example shown in FIG. 7, the ROC (radius of curvature) of the contact surface of protrusions 720 can be less than 1 um. In some examples described herein, a reduction in stiction can be obtained with protrusion features that have a contact surface with an ROC that is between 0.2 um and 10 um, for example.

FIG. 8A through FIG. 8K are cross-sectional views showing the formation of an example reduced contact surface of an example spring tip. The examples of the FIGS. 8A through 8K show the manufacture of a reduced contact surface of a spring tip 204 for contacting the bottom side of a micromirror 201.

Moreover, the described reduced contact surfaces (e.g., such as the contacting surface of spring tip 204) are not limited to contacting micromirrors of DMD devices. The reduced contact surfaces are adapted to be applied to a variety of movable elements included by DMDs as well as other MEMS devices, wherein a small contact surface can reduce stiction forces between moving MEMS elements. (For simplicity, for example, the accompanying FIGURES are not necessarily drawn to scale.)

Figure 8A:
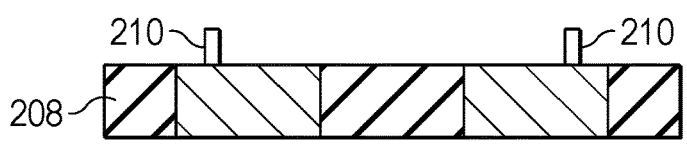
FIG. 8A through FIG. 8K are cross-section views showing the formation of an example reduced contact surface of an example spring tip.

In FIG. 8A, the example CMOS substrate 208 has been fabricated as an example result of semiconductor processing operations to form circuitry and memory cells, as described hereinabove with reference with FIGS. 2 and 3. The supports 210 have been fabricated by a process that includes a photoresist layer (which has been removed), such as a photoresist adapted to form cavities for forming the support 210.

Figure 8B:
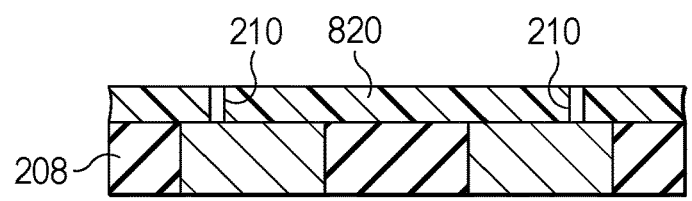

FIG. 8B illustrates formation of an example photoresist layer 820, such as a photoresist spacer layer. The photoresist layer 820 is deposited upon an upper surface of the substrate 208. Photoresist layer 820 includes a depth to provide vertical relief (e.g., vertical clearance) for a next level element of the MEMS to be formed, such as the spring tip 204 (e.g., as described hereinbelow).

Figure 8C:
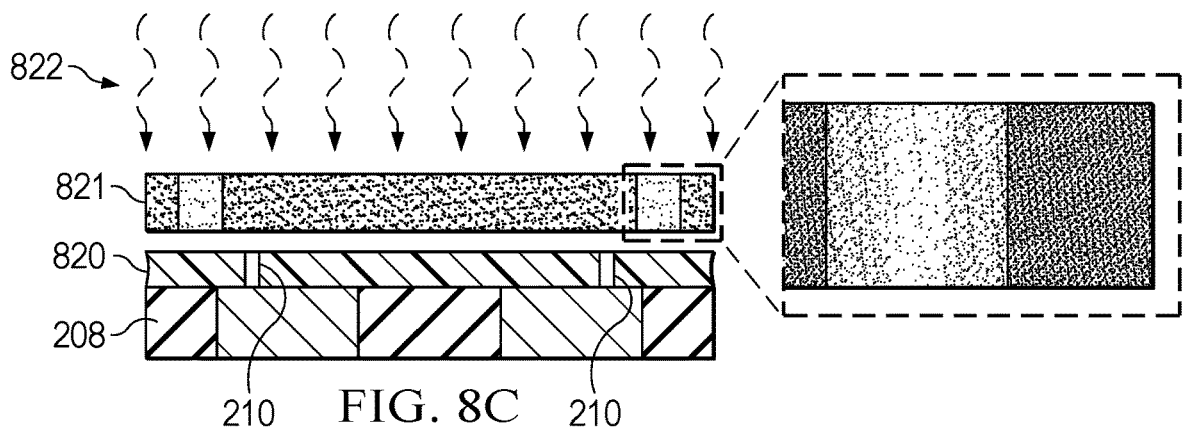

FIG. 8C illustrates an example gray-scale mask 821 that is patterned to expose selected portions of the photoresist layer 820 to light 822, which can be focused energy, such as ultraviolet (UV) or other short wavelength radiation. The photoresist layer 820 is exposed to the light 822 through a gray-scale lithographic mask to form a cavity in an upper surface of the photoresist layer 820. Gray-scale lithography processes can include a sub-resolution, two dimensional binary optical mask that is illuminated by a photolithography stepper system adapted to locally modulate the intensity of ultraviolet light or other focused radiation (e.g., for forming the cavities 823, described hereinbelow with respect to FIG. 8D).

The modulated intensity of light 822 (e.g., modulated by sub-resolution features of the gray-scale mask 821) exposes a photoresist to selected gradients and depths. The gradient of the curvature of the cavity includes changes in depth that are less than the wavelength of light used to pattern the photoresist layer 820. For example, the cavities 823 and 824 (e.g., which can be precursor structures for shaping the contactor spring) include a design feature (e.g., change of depth of a curvature such as the gradient of the curvature) having a length that is less than a wavelength of energy applied to pattern the photoresist layer by which the cavity is formed.

After the exposed photoresist is developed, a gradient height profile (e.g., as formed by the depths of gradient exposures) is formed in the currently remaining portions of the photoresist layer 820. For example, the design feature can be a change of depth (e.g., gradient) of a curvature of an upper surface of a cavity, wherein least one point of the curvature is closer to the substrate (e.g., 208) than other points of the curvature (e.g., the design feature can be adapted to form the surface point 932 of the sloped surface of the cavity 918 shown in FIG. 9).

The gray-scale mask 821 can be designed with sub-resolution features adapted to effect diffraction of the UV light of optical lithographic processes. Different opaque sub-resolution feature sizes can be included to create different diffraction patterns (e.g., for forming sub-resolution features in an underlying photoresist). In a configuration where the different diffraction patterns are passed through the optical lens system of a photolithography stepper, the different diffraction patterns are converted to different intensity levels (e.g., so that different depths of photoresist are exposed).

The differing sizes of opaque sub-resolution feature sizes of the gray-scale mask 821 can be referred to as gray levels, with each level (of the gray levels) of the gray-scale mask 821 adapted to change the intensity of the light 822 by a selected amount. The technique of gray-scale photolithography allows formation of a curved surface (e.g., of radius R, of FIG. 9) of the spring tip 204 in which the curved surface has a change in depth that is smaller than the wavelength of light 822 applied to manufacture the pixel modulator element 200.

To generate different gray levels, the size (e.g., width) of the opaque features can be changed while remaining within a set pitch. Generally, the smaller the opaque feature, the larger amount of intensity of light 822 that passes through the optical lens system onto the photoresist layer 820.

Figure 8D:
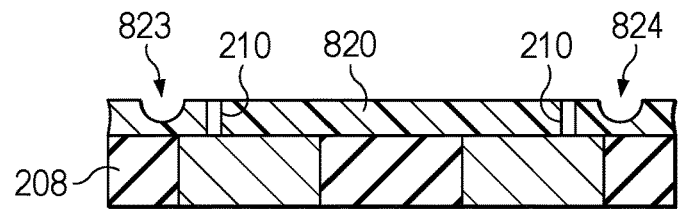

FIG. 8D illustrates a first set of example cavities. The cavities 823 and 824 can be formed in photoresist layer 820 after the exposed photoresist layer is developed. In a configuration where a positive resist is used, the exposed portion of the photoresist layer 820 is softened due to the exposure of light 822, and the exposed portion washed away during the development process. In a configuration where a negative resist is used, the exposed portion of the photoresist layer 820 is hardened due to the exposure of light 822, and the unexposed portion washed away during the development process (a photographic negative of the pattern being transferred is used in conjunction with a negative resist).

In the example, the gradient and depth of each of the cavities 823 and 824 can be controlled by the exposure time and intensity of light 822. The cavities 823 and 824 can be a cylindrically shaped in cross-section. The cavities 823 and 824 are shaped to form a surface of (e.g., a lower surface of) respective spring tip 204 cavity (e.g., see cavity 918 of the contactor spring 912 of FIG. 9). Other cavity shapes (such as a "v"-shaped cavity) can be manufactured to form additional shapes of spring tip 204 cavities.

Figure 8E:
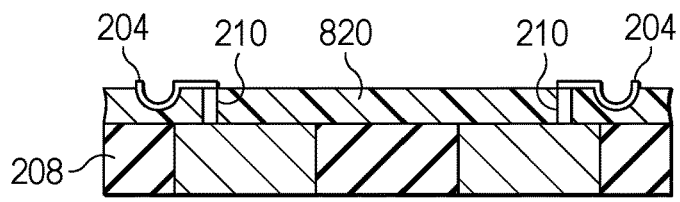

FIG. 8E shows an example spring tip 204 formed by a deposition of a deformable metal layer over the cavities 823 and 824 of the photoresist layer 820. The spring tips 204 can be formed by depositing a deformable metal layer over the cavities 823 and 824 formed in the upper surface of the photoresist layer 820, so that the deformable metal layer includes an upper surface having a cavity that follows (e.g., is conformed to) the gradient contours of the cavities 823 and 824. The cavity 918 (e.g., contactor spring cavity) of the deformable metal layer can be formed in accordance with in the contours (e.g., cavities 823 and 824) formed in the exposed surface of the photoresist layer 820. For example, the cavity in the upper surface of the photoresist layer is arranged to form a spring tip 204 that includes a reduced contact surface that is distal (e.g., with respect to a proximal, supported end of the spring tip 204) to the cavity of the spring tip 204.

Figure 8F:
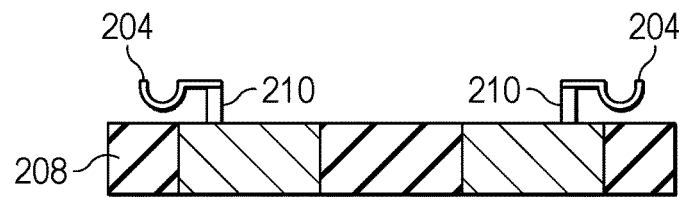

FIG. 8F shows the example spring tips 204 after removal of photoresist layer 820. The photoresist layer 820 is a sacrificial layer that is removed to form a void (e.g., air gap) between the spring tip 204 and the substrate 208. The support 210 supports (e.g., cantilevers) a proximal end of the spring tip 204, so that the contact surface (e.g., that is adjacent to a contacting micromirror) on the terminal end of the spring tip 204 is free (e.g., having sufficient clearance) to flex towards the substrate 208 (e.g., flex downwards) in response to forces applied by a contacting micromirror.

The cavity of the spring tips 204 is adapted to form a contact having a reduced contact surface area (which reduces stiction between the spring tip 204 and a micromirror 201). The cavity of the spring tips 204 also increases the effective mechanical length (while not necessarily affecting the overall length) of the spring tip 204 extent, so that the spring tip 204 can absorb and store additional energy (e.g., stored in the curved portion of the spring tip 204) by flexing along the spring tip cavity in response to being "hit" by an impinging, contacting micromirror 201.

For example, the cavity of the spring tips 204 is adapted to convert, to stored energy, energy received from a micromirror during a first movement in a first direction and is adapted to release the stored energy during a second movement of the micromirror in a second direction (e.g., so that the released stored energy is generated from the stored energy received from the micromirror during the movement in the first direction). The increase in the stored energy (e.g., stored in the curved portion of the spring tip 204) provides additional energy density for overcoming stiction between the spring tip 204 and a micromirror 201. The increase in the stored energy density can allow, for example, smaller pitches (e.g., greater numbers per unit area) of micromirrors 201 in a pixel modulator element 200.

The lower surface of the cavity of the spring tip 204 is adapted to form a surface of a reduced contact that is adjacent to the substrate 208. In an example where heat is applied (e.g., such as heat that is applied during subsequent manufacturing processes or during operation) to a device including a spring tip 204, the spring tip 204 can sag (e.g., in response to an elevation in temperature of the spring tip 204) and come into contact with an adjacent surface (e.g., upper surface of the substrate 208). In response to the spring tip 204 contacting the upper surface of the substrate 208, stiction can captivate the spring tip 204 against the substrate, which can cause a "stuck" pixel. The lower curved surface of the cavity of the spring tip 204 includes a reduced contact surface, which reduces stiction that can otherwise occur (e.g., as described hereinabove with respect to FIG. 6A).

In various examples, a reduced contact surface is coupled to a planar surface of elements (such as portions of the spring tip 204, the micromirror 201 and/or the torsion spring 203) where the planar surface is a lower surface that is adjacent to (e.g., above) the substrate 208 and where a void exists between the reduced contact surface and the substrate. The reduced contact surface extends from the planar surface (such as the spring tip 204, the micromirror 201 and/or the torsion spring 203) and toward the substrate. The various reduced contact surfaces can be formed as protrusions arranged in various patterns (such as arranged beneath selected suspended elements or arranged in linear or grid patterns) to reduce contact surface areas that can otherwise occur under conditions that cause expansion (e.g., thermal expansion) of deformable metal elements of the pixel modulator element 200.

Figure 8G:
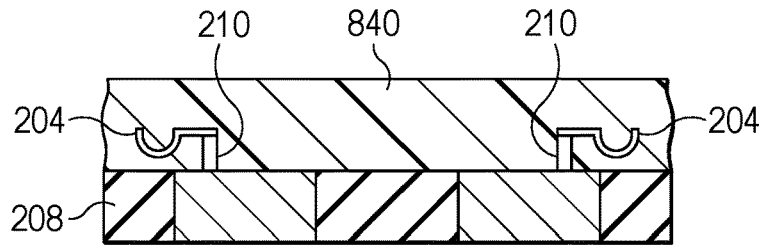

In FIG. 8G, the example spring tips 204 are shown after being encapsulated by a photoresist layer 840. The photoresist layer 840 includes a support spacer of a selected thickness adapted to form a vertical relief (e.g., clearance) sufficient to allow freedom of movement during operation of a next level element of the MEMS, such as micromirror 201 (to be formed as described hereinbelow).

Figure 8H:
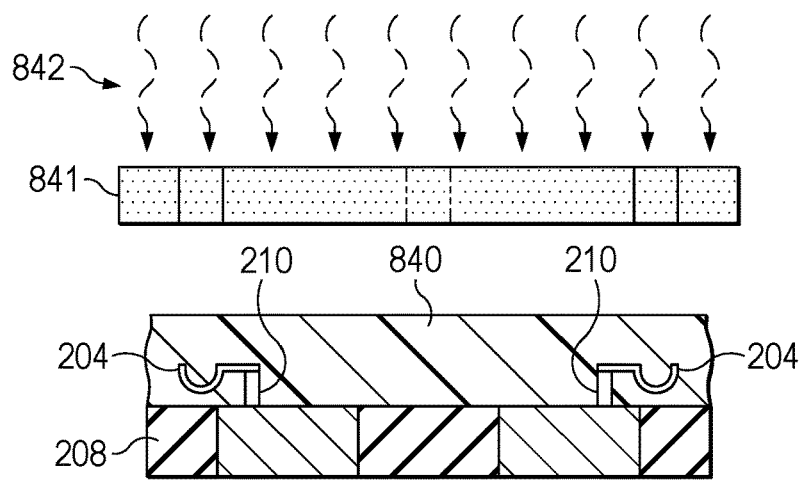

FIG. 8H shows a cross-section view of an example gray-scale mask 841 that is patterned to expose selected portions of photoresist layer 840 in response to being illuminated by light 842 (e.g., which can be UV or another frequency of short wavelength radiation). Gray-scale lithography processes expose the photoresist layer 840 to form gradients of selected depths (e.g., for delimiting the surface of a curved cavity) of reduced contact surfaces (e.g., protruding contact surfaces such as 846 and 847 of a micromirror 201 and such as the auxiliary hinge support 849, as described hereinbelow). After the exposed photoresist is developed (and removed), a gradient height profile of the patterned (e.g., sculpted top surface of the) photoresist remains (e.g., as patterned in response to the gray-scale mask 841).

Figure 8I:
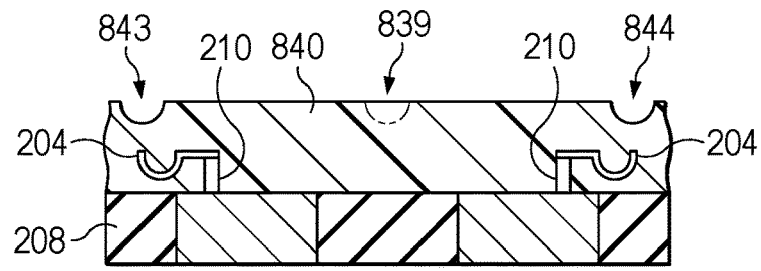

FIG. 8I shows a second set of example cavities. The cavities 839, 843 and 844 can be formed in photoresist layer 840 after the exposed photoresist layer is etched (e.g., in an example where the photoresist layer 840 includes a positive photoresist). The exposed portion of the photoresist layer 840 is softened by exposure to light 842 and washed away during the development process. In the example, the depth (e.g., degree and extent of curvature) of the cavities 839, 843 and 844 can be controlled by the exposure time and intensity of light 842. The cavities 839, 843 and 844 can be a cylindrical section adapted to shape protruding contact surfaces, such as 846 and 847 of a micromirror 201 and such as the auxiliary hinge support 849. Other cavity shapes can be adapted to shape additional types of protrusions of a later-deposited, metal layer 845.

Figure 8J:
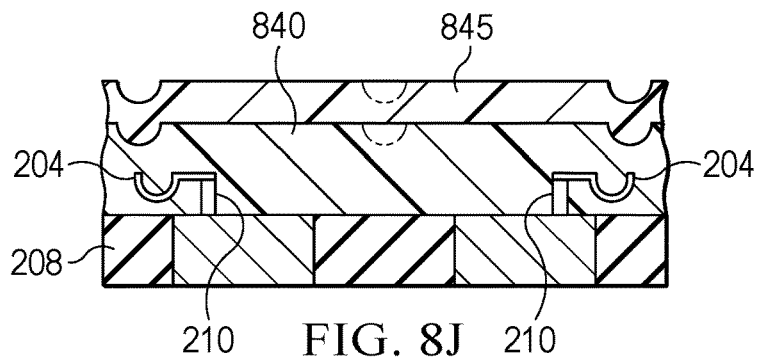

FIG. 8J shows an example metal layer 845 deposited on the exposed (e.g., upper) surface of the photoresist layer 840, so that the metal layer 845 conforms to the cavities 839, 843 and 844. Metal layer 845 includes a deformable metal that can be patterned and etched using fabrication techniques to form a MEMS element such as micromirror 201, as described hereinbelow with reference to FIG. 8K.

Figure 8K:
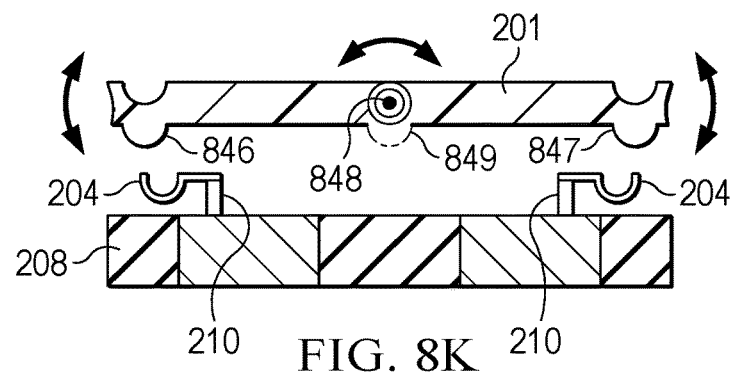

FIG. 8K illustrates an example micromirror 201 (e.g., as a completed micromirror) after removal of photoresist layer 840 and patterning and etching of the metal layer 845. Micromirror 201 includes protruding contact surfaces 846 and 847 that are configured to contact the spring tips 204 in response to the micromirror 201 moving (e.g., tilting) to the right or left (e.g., rotating clockwise or anticlockwise around pivot axis 848). Pivot axis 848 extends longitudinally through the torsion spring 203 and intersects a center axis of a support 210 (e.g., adapted to support the torsion spring 203, as shown in FIG. 2 in orthographic view).

The auxiliary hinge support 849 is an example of a reduced contact surface. The auxiliary hinge support 849 is included by (e.g., is coupled to) the torsion spring 203 about which the mirror is adapted to move in a first direction (e.g., ON) and a second direction (e.g., OFF). The auxiliary hinge support 849 can be a downwards-extending protrusion of the torsion spring 203 (and/or an upwards-extending protrusion, not shown, of the underlying substrate 208). The auxiliary hinge support 849 is arranged to reduce the contact areas (e.g., and areas adjacent to the contact areas, as described above with reference to FIG. 6A through FIG. 6C) that can occur between the torsion spring and a corresponding contact surface (e.g., reduced contact surface) formed on an adjacent surface of the underlying substrate (e.g., substrate 208).

In an example, subsequent manufacturing processes and/or device operation can include the application of heat, which can be absorbed by the completed torsion spring 203, so that the torsion spring 203 expands (e.g., expands longitudinally). The expansion of the torsion spring 203 can cause the torsion spring to sag, so that a portion (e.g., auxiliary hinge support 849) of the torsion spring 203 moves towards, contacts and potentially adheres to an underlying structure (e.g., substrate 208). Stiction (such as described with reference to surfaces 641 and 642 of FIG. 6A) can occur at the contacting surfaces of the torsion spring 203 and the substrate 208.

As described herein, the stiction is reduced from levels that can otherwise occur in the absence of the described auxiliary hinge support 849, where such levels can result in the persistent adhesion of the torsion spring 203 (e.g., adhered by the stiction itself, and/or by head-space reactive chemical species introduced while the stiction binds the torsion spring 203 to the substrate 208). The persistent adhesion can result in permanent, visible pixel defects of the display system 100. In various examples, the auxiliary hinge support 849 can be formed between the micromirror 201 and the torsion spring 203, and/or formed between the torsion spring 203 and the substrate 208).

FIG. 9 shows an example reduced contact surface of an example spring tip. The spring tip 900 can be (or include) a spring tip 204, as described herein. The spring tip 900 is an element that can include an extension arm 910 (e.g., which can be a flat leaf spring) and a contactor spring 912 (e.g., which can be a curved leaf spring).

The extension arm 910 is coupled between the contactor spring 912 and a support (e.g., 210 that is coupled to the substrate 208), so that a void (e.g., air gap) exists between the spring tip 900 and the substrate. In operation, the spring tip 900 (including the extension arm 910 and the contactor spring 912) flexes towards the substrate (e.g., downwards) into the void in response to being contacted by a substrate-side (e.g., lower) contact surface of a tilted micromirror 201. Accordingly, the extension arm is adapted to convert, to stored energy, energy received from the micromirror during a first movement in the first direction and is adapted to release the stored energy during a second movement in the second direction.

The contactor spring 912 includes a first portion (e.g., proximal portion) coupled to a support (e.g., through the extension arm 910) and includes a second portion (distal portion) that includes a cavity 918 having a sloped surface (e.g., upper and/or lower sloped surface). The first portion is coupled between the support and the second portion. A clearance from the sloped surface to the substrate is widened as the sloped surface extends away from the first portion, and the second portion includes a first contact surface 501 (e.g., that is adapted to contact a surface of a micromirror) adjacent (e.g., distally adjacent) to the sloped surface.

The spring tip 900 includes an upper surface 920 adjacent to a micromirror (which is arranged to overlie the spring tip 900) and includes a lower surface 922 adjacent to the substrate. A centerline 926 notionally extends from a proximal portion through a distal portion of the spring tip 900. In a configuration where the spring tip 900 is apart (e.g., in a neutral position) from the micromirror, there exists a clearance (e.g., distance or height) from a portion (e.g., point) of the upper surface 920 to the micromirror that is less than a clearance from a portion (e.g., surface point 932) of the cavity 918 to the micromirror. In a configuration where the spring tip 900 is in contact with the micromirror (e.g., when the micromirror is landed, as shown in FIG. 5), there exists a clearance (e.g., distance or height) from a portion of the upper surface 920 to the micromirror that is less than a clearance from a portion (e.g., surface point 932) of the cavity 918 to the micromirror.

The upper surface 920 extends horizontally (e.g., as illustrated as extending from left to right) along the extension arm 910: in a proximal portion 914 of the contactor spring 912, the upper surface 920 extends increasingly downwards (towards the substrate) along the curvature of the cavity 918; and in a distal portion 916 of the contactor spring 912, the upper surface 920 (e.g., the height of the upper surface 920) extends increasingly upwards and away from the substrate. The contactor spring 912 includes (e.g., distally includes) a contact surface 501. The contact surface 501 is a terminal portion of the spring tip 204 that is adjacent to a cavity 918 formed by the proximal portion 914 and distal portion 916. The contact surface 501 is adapted to increase the contact angle (e.g., for reducing the areas in which condensation and capillary action can occur) between a contact surface 501 of the spring tip 900 and the lower surface of the micromirror 201. The contact surface 501 is a reduced contact feature for reducing stiction as described hereinabove with respect to FIG. 6A through FIG. 6C.

In cross-sectional view, a sloped surface of cavity 918 can be curved (e.g., having surface points 932 spaced relative to a focus 930 by a radius R), notched (e.g., "v"-shaped), or trapezoidal (e.g., anisotropically formed) or rectilinear (e.g., isotropically formed). The sloped surface of the cavity 918 is arranged: so that a clearance from the sloped surface of the distal portion 916 to the substrate is widened (e.g., increased) as the sloped surface extends (e.g., as projected over increasingly distal portions) away from the proximal portion 914; and so that the distal portion includes a first contact surface adjacent to the sloped surface. In various examples, a surface point 932 (of the upper surface of the cavity 918) can be: lower than a portion of the upper surface 920 of the extension arm; lower than a portion of the centerline 926 of the extension arm; and/or lower than a portion of the lower surface 922 of the extension arm.

In an example method, a reduced contact surface for MEMs devices can be formed as described herein. The example method, comprises: depositing a photoresist layer adjacent to a first surface of a substrate; forming a first cavity in a surface of the photoresist layer; depositing a deformable metal layer adjacent to the surface of the photoresist layer, wherein the deformable metal layer includes a second cavity, the second cavity being formed adjacent to the first cavity, and wherein the deformable metal layer includes a first contact surface; etching the deformable metal layer to form a spring tip that includes the second cavity; removing the photoresist layer to form a void between the spring tip and the substrate; and forming, adjacent to the second cavity, a micromirror that includes a second contact surface positioned over the first contact surface; wherein the micromirror is adapted to move in a first direction to close the first contact surface and the second contact surface; and wherein the micromirror is adapted to move in a second direction to open the first contact surface and the second contact surface.

The example method optionally comprises at least one of: forming a memory cell on the substrate, wherein the memory cell includes circuitry adapted to electronically latch a logic state indicating a selected one of the first and second directions, wherein the spring tip and the micromirror are formed over the memory cell; and forming an electrode over the substrate, wherein the micromirror is formed over the electrode, and wherein the electrode is adapted to electrostatically position the micromirror in response to the logic state latched by the memory cell.

Modifications are possible in the described embodiments, and other embodiments are possible, within the scope of the claims.

What is claimed is:

1. An apparatus, comprising:
   a substrate;
   a first post coupled to the substrate;
   a hinge layer comprising:
      a torsion hinge coupled to the first post; and
      a spring tip coupled to the torsion hinge;
   a second post coupled to the torsion hinge; and
   a mirror coupled to the second post, the mirror having a second contact surface, the spring tip having a first contact surface, a first surface facing the mirror, a second surface facing the substrate, and a third surface facing the mirror, wherein a first distance from a first point of the second surface to the mirror is less than a second distance from a second point of the third surface to the mirror.

2. The apparatus of claim 1, wherein the spring tip is configured to convert, to stored energy, energy received when the second contact surface contacts the first contact surface and to release the stored energy when the second contact surface and the first contact surface separate.

3. The apparatus of claim 1, wherein the spring tip comprises an extension arm and a contactor spring portion, the extension arm coupling the contactor spring portion to the torsion hinge.

4. The apparatus of claim 3, wherein the spring tip is configured to convert, to stored energy, energy received when the second contact surface contacts the first contact surface and is configured to release the stored energy when the second contact surface and the first contact surface separate.

5. The apparatus of claim 3, wherein the contactor spring portion is hook shaped.

6. The apparatus of claim 3, wherein the contactor spring portion is curved, notched, trapezoidal, or rectilinear.

7. The apparatus of claim 1, wherein the first distance is less than the second distance in when the first contact surface and the second contact surface are separated.

8. The apparatus of claim 1, further comprising a memory cell in the substrate, wherein the mirror is configured to reflect light in response to a memory state of the memory cell.

9. The apparatus of claim 1, wherein the second contact surface is on a protrusion of the mirror.

10. The apparatus of claim 1, the hinge layer further comprising first and second electrodes, wherein the mirror is configured to move in a first direction in response to a first voltage the first electrode, and wherein the mirror is configured to move in a second direction in response to a second voltage on the second electrode.

11. A microelectromechanical system (MEMS) device comprising:
    a hinge layer comprising:
       a torsion hinge; and
       a spring tip coupled to the torsion hinge, the spring tip comprising a contactor spring portion and an extension arm between the spring tip and the torsion hinge, the contactor spring portion having a first contact surface, wherein the contactor spring portion is curved;

a mirror have a second contact surface, the second contact surface configured to contact the first contact surface, and the second contact surface configured to separate from the first contact surface; and a post coupling the mirror and the torsion hinge.

12. The MEMS device of claim 11, wherein the contactor spring portion has a cavity.

13. The MEMS device of claim 11, wherein the contactor spring portion is a curved leaf spring.

14. The MEMS device of claim 11, wherein the mirror comprises a protrusion, the second contact surface on the protrusion.

15. The MEMS device of claim 11, wherein the first contact surface is at an end of the contactor spring portion.

16. The MEMS device of claim 11, wherein the post is a first post, the MEMS device further comprising:

a substrate; and a second post coupling the torsion hinge to the substrate.

17. The MEMS device of claim 16, wherein the substrate comprises a complementary metal oxide semiconductor (CMOS) memory cell and the hinge layer comprises an electrode, the electrode over the CMOS memory cell.

18. A microelectromechanical system (MEMS) device comprising:

a hinge layer comprising:

a torsion hinge; and a spring tip coupled to the torsion hinge, the spring tip comprising a contactor spring portion and an extension arm between the spring tip and the torsion hinge, the contactor spring portion having a first contact surface;

a mirror having a protrusion, the protrusion having a second contact surface, the second contact surface configured to contact the first contact surface, and the second contact surface configured to separate from the first contact surface; and a post coupling the mirror and the torsion hinge.

19. The MEMS device of claim 18, wherein the protrusion is a linear wedge.

* * * * *